United States Patent [19]
Frank et al.

[11] Patent Number: 5,589,766
[45] Date of Patent: Dec. 31, 1996

[54] FIELD-TESTABLE INTEGRATED CIRCUIT AND METHOD OF TESTING

[75] Inventors: Paul A. Frank, Albany; Donald T. McGrath; Daniel A. Staver, both of Scotia, all of N.Y.

[73] Assignee: General Electric Company, Schenectady, N.Y.

[21] Appl. No.: 417,576

[22] Filed: Apr. 6, 1995

[51] Int. Cl.$^6$ .................................................. G01R 31/02
[52] U.S. Cl. ........................ 324/158.1; 324/73.1; 324/763
[58] Field of Search ................................ 324/73.1, 158.1, 324/765, 759, 763; 371/22.1, 22.5, 22.3, 22.6, 15.1, 25.1; 364/550.1, 480

[56] References Cited

U.S. PATENT DOCUMENTS

| | | | |
|---|---|---|---|
| 4,635,259 | 1/1987 | Schinabeck et al. | 371/25.1 |
| 4,724,379 | 2/1988 | Hoffman | 324/158.1 |
| 4,929,888 | 5/1990 | Yoshida | 324/158.1 |
| 4,931,723 | 6/1990 | Jeffrey et al. | 324/158.1 |
| 4,972,144 | 11/1990 | Lyon et al. | 324/765 |

*Primary Examiner*—Vinh P. Nguyen
*Attorney, Agent, or Firm*—Marvin Snyder

[57] ABSTRACT

A field-testable integrated circuit that includes a plurality of analog signal channels for receiving a respective analog signal during a normal mode of operation is provided. Individual test circuits are built-in within the integrated circuit for selecting respective ones of the plurality of channels to receive predetermined reference signals during a test mode of operation while uninterruptedly providing the normal mode of operation in any remaining unselected channels. Each test circuit includes a channel decoder responsive to predetermined channel select signals for producing a respective channel decoder output signal. A multiplexer is responsive to predetermined reference select signals and to the decoder output signal for supplying during the test mode of operation a selected one of the predetermined reference signals to the respective analog channel being coupled to the individual test circuit therein. A switching gate is responsive to the respective channel decoder output signal so that during the normal mode of operation the switching gate is in a respective conducting state for allowing the respective analog signal to pass therethrough while during the test mode of operation the switching gate is in a respective nonconductive state for interrupting the respective analog signal from passing therethrough.

8 Claims, 2 Drawing Sheets

FIELD-TESTABLE INTEGRATED CIRCUIT AND METHOD OF TESTING

BACKGROUND OF THE INVENTION

The field of the present invention is generally related to integrated circuits and, more particularly, to a field-testable integrated circuit having a plurality of analog signal channels with built-in test circuits, and to a method for field-testing such integrated circuit.

Generally, in situ testing of integrated circuit devices is desirable since such testing would allow for performing diagnostics in any field or site where these devices are deployed. However, as integrated circuits become ever more densely fabricated on any given semiconductor chip, the ability to monitor the performance and integrity of these integrated circuits using conventional testing techniques has become increasingly difficult. It is also desirable to provide a test circuit which uses relatively few circuit components so that the test circuit does not occupy a substantial portion of the total area of the chip where the integrated circuit is fabricated since the more chip area is allocated to the test circuit, the less chip area which remains for performing the normal functions provided by the chip. This allows for avoiding any substantial increases in the size of the chip area since the size of the chip area is directly related to the cost of the chip. Further, prior testing techniques typically limit the operational capability of the device undergoing testing since during testing the device is generally placed "off-line", thus interrupting any of the normal functions provided by the device and adding to the operational costs of the device. In general, the user has no means for performing preventative diagnostics in the field until a "hard failure" occurs and all operational capability is lost. Thus it is desirable to provide a field-testable integrated circuit which provides substantial operational capability even while undergoing testing.

SUMMARY OF THE INVENTION

Generally speaking, the present invention fulfills the foregoing needs by providing a field-testable integrated circuit that includes a plurality of analog signal channels for receiving a respective analog signal during a normal mode of operation, and circuit means, such as individual test circuits, for selecting respective ones of the plurality of channels to receive predetermined reference signals during a test mode of operation while uninterruptedly providing the normal mode of operation in any remaining unselected channels in the integrated circuit. Preferably each test circuit includes a channel decoder responsive to predetermined channel select signals for producing a respective channel decoder output signal. A multiplexer is responsive to predetermined reference select signals and to the decoder output signal for supplying during the test mode of operation a selected one of the predetermined reference signals to the respective analog channel being coupled to the individual test circuit therein. A switching gate is responsive to the respective channel decoder output signal so that during the normal mode of operation the switching gate is in a respective conducting state for allowing the respective analog signal to pass therethrough while during the test mode of operation the switching gate is in a respective nonconductive state for interrupting the respective analog signal from passing therethrough.

A method for field-testing an integrated circuit can be performed by providing a plurality of analog channels for receiving a respective analog signal during a normal mode of operation. A selecting step allows for selecting respective ones of the plurality of analog channels to receive predetermined reference signals during a test mode of operation while uninterruptedly providing the normal mode of operation in any remaining unselected channels. If desired, the selecting step can be employed for simultaneously selecting each of the plurality of signal channels to be in the test mode of operation.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like numbers represent like parts throughout the drawings, and in which:

DETAILED DESCRIPTION OF THE INVENTION

Figure 1:
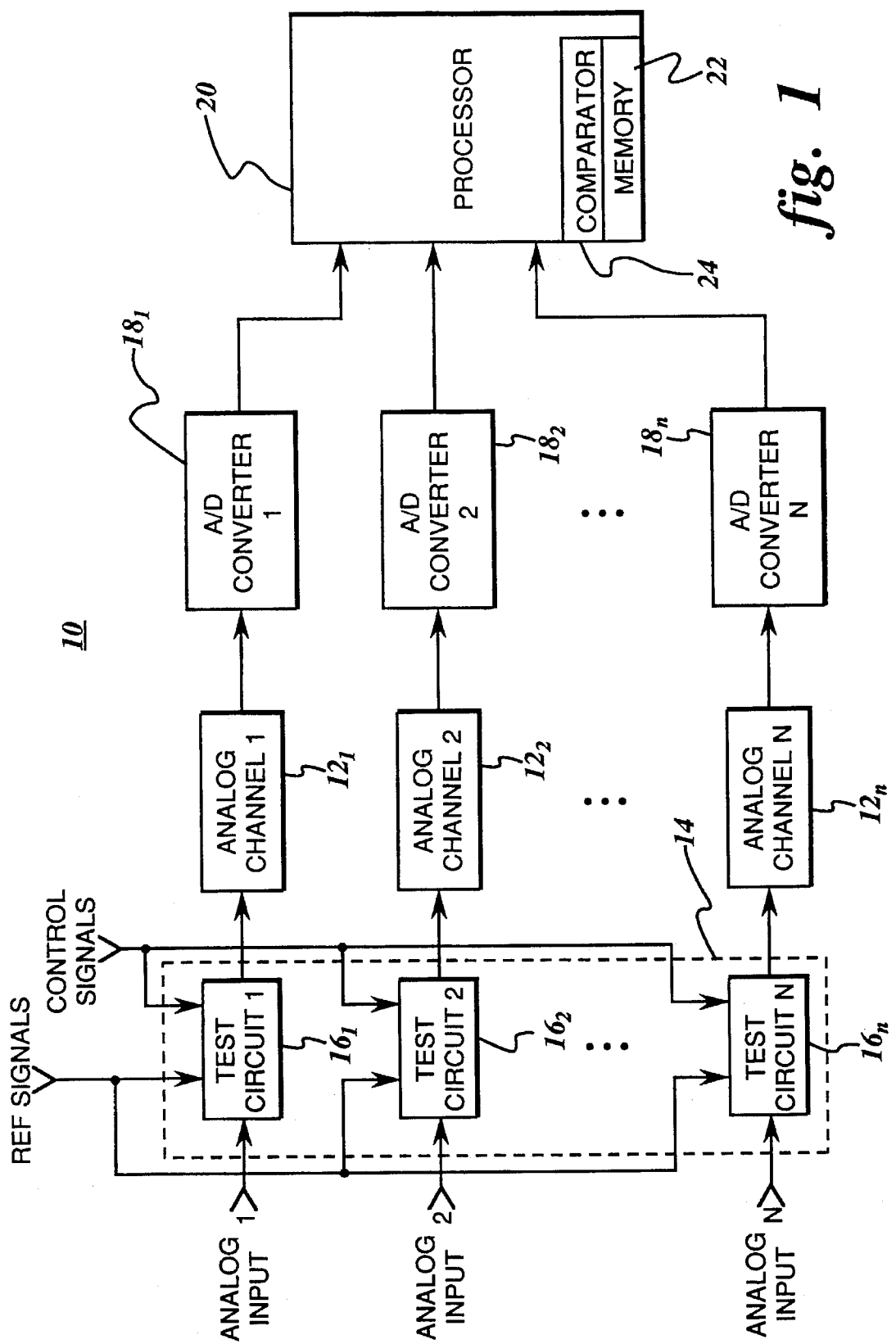
FIG. 1 shows a schematic block diagram representation for a field-testable integrated circuit in accordance with the present invention including a plurality of individual test circuits.

FIG. 1 shows a field-testable integrated circuit 10 made up of a plurality of analog signal channels $12_1$–$12_n$ for receiving a respective analog signal during a normal mode of operation. For instance, each analog signal may represent a current or voltage measurement obtained from a suitable sensing device (not shown), such as a current sensor device and the like. Circuit means 14, such as made up by a plurality of individual test circuits $16_1$–$16_n$, is provided for selecting respective ones of signal channels $12_1$–$12_n$ to receive predetermined reference signals during a test mode of operation. In accordance with a key advantage of the present invention, this can be accomplished while uninterruptedly providing the normal mode of operation in any remaining unselected channel in integrated circuit 10. For example, if analog channel $12_1$ is selected to receive any reference signal during the test mode of operation, the remaining unselected channels $12_2$–$12_n$ would still continue to operate in the normal mode of operation. This is a desirable feature since a field-testable integrated circuit in accordance with the present invention can provide substantial functionality even at times during which any selected one of the signal channels is undergoing testing.

FIG. 1 further shows a plurality of analog-to-digital (A/D) converters $18_1$–$18_n$ for digitizing any analog signal carried or supplied through any respective one of the analog channels. For example, during the normal mode of operation A/D converters $18_1$–$18_n$ can readily digitize any analog signal representative of current and/or voltage measurements obtained from any current sensing device, as described above, whereas during the test mode of operation the same A/D converters $18_1$,$18_n$ can be employed for digitizing any of the predetermined reference signals so as to produce digitized reference signals having a respective value. A processor 20 is coupled to A/D converters $18_1$–$18_n$ to provide, for example, any desired signal processing to any measurement signals being supplied during the normal mode of operation. Processor 20 can readily incorporate a memory 22, preferably a non-volatile memory such as an Erasable Programmable Read Only Memory (EPROM), Electrically Erasable Programmable Read Only Memory (EEPROM) and the like. Memory 22 can be used for storing predetermined expected values for the digitized reference signals. Processor 20 can also incorporate a comparator module 24 for comparing the respective values of the digitized reference signals against the predetermined expected values stored in memory 22. Thus, based on the results of the comparison, a user would be able to determine the presence of faults, such as signal level degradation and the like, in any channel selected for testing as described above. For example, if the expected value for the supplied reference signal in a selected channel is 5 V, but the digitized reference signal deviates from the expected value by a predetermined threshold value, then the user would be able to declare a fault for the selected signal channel.

Figure 2:
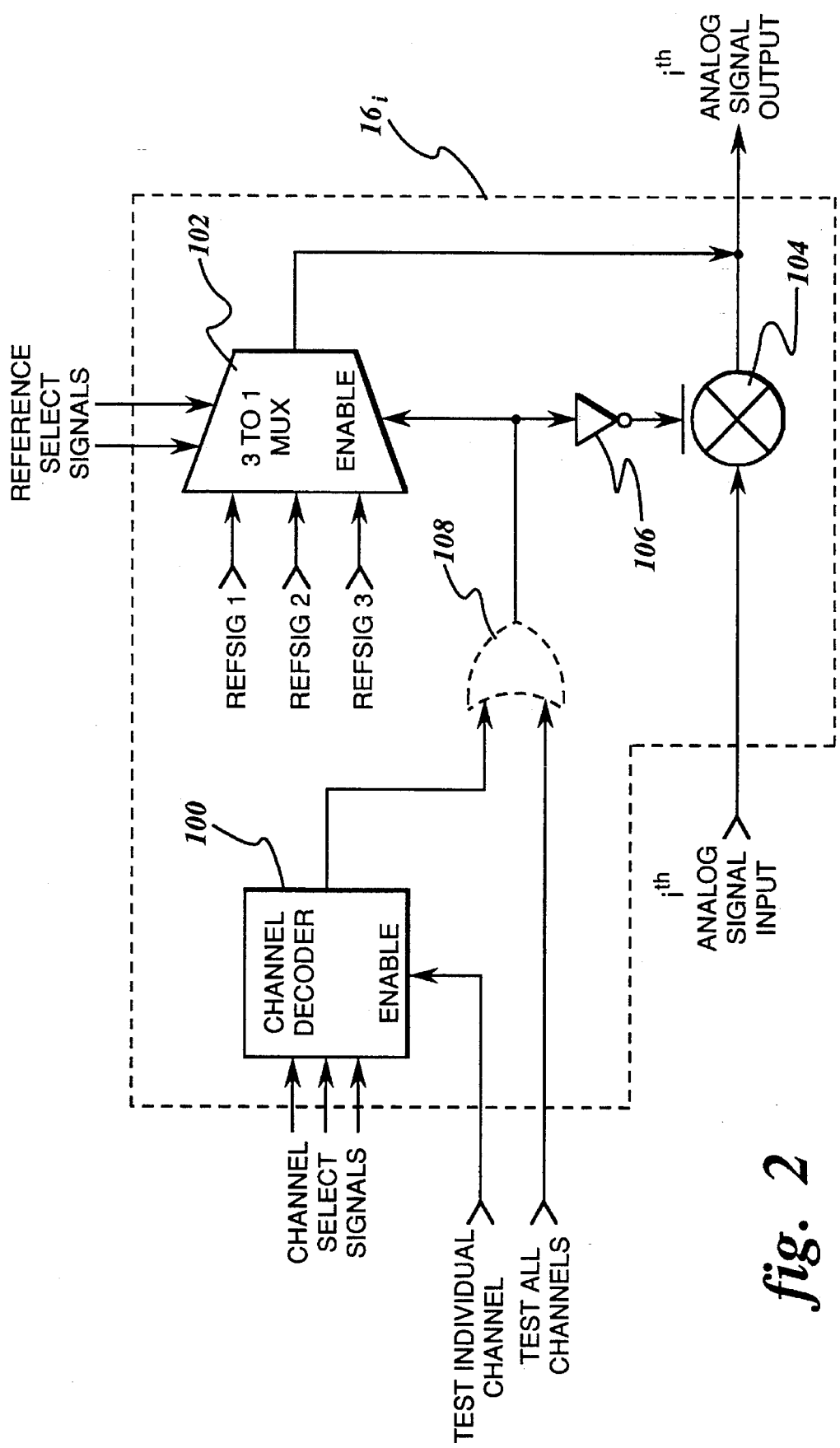
FIG. 2 shows a schematic block diagram representation for any of the individual test circuits shown in FIG. 1.

FIG. 2 is a block diagram for any given one of the individual test circuits $16_1$–$16_n$ shown in FIG. 2. As shown in FIG. 2, any individual test circuit $16_i$ has a channel decoder 100 responsive to predetermined channel select signals for producing a respective channel decoder output signal. Channel decoder 100 conveniently enables the user to select which particular signal channel is to undergo testing in accordance with the present invention. For example in FIG. 2, channel decoder 100 is shown as receiving three separate channel select signals. This example assumes that integrated circuit 10 (FIG. 1) has at most eight separate analog channels being that in general the minimum number of channel select signals required is given by $\log_2(n)$, where n is the total number of channels in the integrated circuit. In this example, the three channel select signals would allow for selecting any given one of the eight signal channels depending on the respective states for such channel select signals. A multiplexer 102 is responsive to predetermined reference select signals and to the decoder output signal for supplying during the test mode of operation a selected one of the predetermined reference signals to the respective analog channel being coupled to the individual test circuit therein. The decoder output signal is supplied to the enable port of multiplexer 102 so that, depending on the state of the decoder output signal, multiplexer 102 supplies one of the selected reference signals during the test mode of operation. Conversely, during normal operation, the state of the decoder output signal would be chosen so that none of the predetermined reference signals is supplied by multiplexer 102 so as to not interfere with the normal operation of the integrated circuit. By way of example, multiplexer 102 is shown as receiving three different reference signals identified as REFSIG$_{1-3}$, and thus multiplexer 102 is conveniently chosen as a three-to-one multiplexer. In this example, the number of reference select signals is two being that this allows for selecting any given one of the three reference signals depending on the respective states for such reference select signals. It will be appreciated that the present invention need not be limited to a three-to-one multiplexer being that, if desired, additional reference signals can be readily supplied to multiplexer 102. A switching gate 104 is responsive to the channel decoder output signal, either directly, or through an optional OR gate 108 (represented by a dashed line), so that during the normal mode of operation the switching gate is in a respective conductive state for allowing the respective analog signal for the analog channel coupled to the test circuit therein to pass therethrough. In this example, test circuit 16*i* would be coupled to the ith channel and thus during the normal mode of operation the switching gate in test circuit 16*i* would allow the respective analog signal for the ith channel to pass therethrough. Conversely, during the test mode of operation, switching gate 104 in test circuit 16*i* could be in a respective nonconductive state for interrupting the respective analog signal for the ith channel from passing therethrough. Switching logic means, such as optional OR gate 108, can be conveniently employed for simultaneously selecting each of the plurality of signal channels to be in the test mode of operation, if so desired. For example, by properly selecting the state of the signal identified as "TEST ALL CHANNELS" the user would be able to simultaneously cause switching gate 104 in each test circuit be in the nonconducting state while enabling multiplexer 102 in each test circuit to supply any selected reference signal. A signal inverter 106 can be employed for providing suitable signal inversion to the output signal from OR gate 108. In operation, the field-testable integrated circuit in accordance with the present invention allows for efficiently providing at a relatively low cost substantial functionality even when any one of the selected channels is undergoing testing.

In accordance with the present invention, a method for field-testing an integrated circuit can be performed by providing a plurality of analog channels, such as channels $16_1$–$16_n$, $16_n$ in FIG. 1, for receiving a respective analog signal during a normal mode of operation. A selecting step allows for selecting respective ones of the plurality of analog channels to receive predetermined reference signals during a test mode of operation while uninterruptedly providing the normal mode of operation in any remaining unselected channels. If desired, the selecting step can be employed for simultaneously selecting each of the plurality of signal channels to be in the test mode of operation. The method in accordance with the present invention can further include the steps of digitizing any predetermined reference signals received during the test mode of operation so as to produce digitized reference signals having a respective value. For example, the digitizing step can be implemented using the A/D converters $18_1$–$18_n$ (FIG. 1). A memory, such as memory 22 (FIG. 1) is provided for storing predetermined expected values for the digitized reference signals. A comparing step, for example, conveniently allows for comparing the respective values of the digitized reference signals against the predetermined expected values. This conveniently allows for determining the presence of faults in any channel selected for testing in the integrated circuit.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A field-testable integrated circuit comprising:

a plurality of analog signal channels for receiving a respective analog signal during a normal mode of operation;

signal processing means coupled to said plurality of analog signal channels for utilizing the analog signals received by said plurality of analog signal channels; and circuit means for selecting respective ones of said plurality of channels to receive a predetermined reference instead of said respective analog signal during a test mode of operation while permitting the normal mode of operation to continue uninterruptedly in any remaining unselected channels in said integrated circuit.

2. The integrated circuit of claim 1 wherein said circuit means comprises a plurality of individual test circuits each respectively coupled to a respective one of said plurality of analog signal channels.

3. The integrated circuit of claim 2 wherein each individual test circuit comprises:

a channel decoder responsive to predetermined channel select signals for producing a respective channel decoder output signal;

a multiplexer responsive to predetermined reference select signals and to the decoder output signal for supplying during the test mode of operation a selected one of the predetermined reference signals to the respective analog channel being coupled to the individual test circuit therein; and a switching gate responsive to the respective channel decoder output signal so that during the normal mode of operation said switching gate is in a respective conducting state for allowing the respective analog signal for said analog channel to pass therethrough while during the test mode of operation said switching gate is in a respective nonconductive state for interrupting the respective analog signal for said analog channel from passing therethrough.

4. The integrated circuit of claim 2 further comprising switching logic means for simultaneously selecting each of said plurality of signal channels to be in the test mode of operation.

5. The integrated circuit of claim 4 further comprising:

means for digitizing any of the predetermined reference signals from said multiplexer during the test mode of operation so as to product digitized reference signals having a respective value;

and wherein said signal processing means includes
a memory for storing predetermined expected values for said digitized reference signals, and means for comparing the respective values of said digitized reference signals against said predetermined expected values stored in said memory, thereby determining the presence of faults in any selected channel in said integrated circuit.

6. A method for field-testing an integrated circuit, said method comprising the steps of:

providing a plurality of analog signal channels for receiving a respective analog signal during a normal mode of operation;

utilizing the analog signals received by said plurality of analog signal channels when operating in the normal mode; and selecting respective ones of said plurality of channels to receive predetermined reference signals instead of said respective analog signal during a test mode of operation while permitting the normal mode of operation to continue uninterruptedly in any remaining unselected channels in said integrated circuit.

7. The field-testing method of claim 6 wherein the selecting step further comprises simultaneously selecting each of said plurality of signal channels to be in the test mode of operation.

8. The field-testing method of claim 6 further comprising the steps of:

digitizing received predetermined reference signals received during the test mode of operation so as to produce digitized reference signals having a respective value;

providing a memory for storing predetermined expected values for said digitized reference signals; and comparing the respective values of said digitized reference signals against said predetermined expected values, thereby determining the presence of faults in any selected channel in said integrated circuit.

* * * * *